(12) United States Patent
Sugawara

(10) Patent No.: US 9,082,807 B2
(45) Date of Patent: Jul. 14, 2015

(54) LID OPENING AND CLOSING DEVICE

(75) Inventor: Yudo Sugawara, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 671 days.

(21) Appl. No.: 13/426,006

(22) Filed: Mar. 21, 2012

(65) Prior Publication Data

US 2012/0241032 A1    Sep. 27, 2012

(30) Foreign Application Priority Data

Mar. 25, 2011    (JP) .................................. 2011-68399

(51) Int. Cl.
*H01L 21/677* (2006.01)
*H01L 21/687* (2006.01)

(52) U.S. Cl.
CPC .... *H01L 21/68735* (2013.01); *H01L 21/67772* (2013.01); *Y10T 137/794* (2015.04); *Y10T 137/8376* (2015.04)

(58) Field of Classification Search
CPC ................................................ H01L 21/67772
See application file for complete search history.

(56) References Cited

U.S. PATENT DOCUMENTS

| | | | | |
|---|---|---|---|---|
| 4,687,542 | A * | 8/1987 | Davis et al. ..................... | 438/716 |
| 5,169,272 | A * | 12/1992 | Bonora et al. ............. | 414/217.1 |
| 6,152,669 | A * | 11/2000 | Morita et al. .................. | 414/217 |
| 6,261,044 | B1 * | 7/2001 | Fosnight et al. .............. | 414/217 |
| 6,302,927 | B1 * | 10/2001 | Tanigawa ..................... | 29/25.01 |
| 7,789,609 | B2 * | 9/2010 | Okabe et al. .................. | 414/217 |
| 7,896,602 | B2 * | 3/2011 | Rebstock ................. | 414/416.08 |
| 8,171,964 | B2 * | 5/2012 | Okabe .............................. | 141/63 |
| 8,418,733 | B2 * | 4/2013 | Shikata et al. .................. | 141/98 |
| 2002/0069933 | A1 * | 6/2002 | Otaguro .......................... | 141/98 |
| 2004/0168742 | A1 | 9/2004 | Kim et al. | |
| 2006/0088406 | A1 * | 4/2006 | Miyajima et al. ............. | 414/805 |
| 2008/0107507 | A1 * | 5/2008 | Bufano et al. ............. | 414/217.1 |
| 2008/0236487 | A1 * | 10/2008 | Hirano et al. .................. | 118/715 |
| 2010/0175781 | A1 * | 7/2010 | Kisakibaru et al. ............. | 141/98 |
| 2012/0237323 | A1 * | 9/2012 | Sugawara ..................... | 414/411 |

FOREIGN PATENT DOCUMENTS

| | | | | |
|---|---|---|---|---|
| EP | 0484681 A1 * | 5/1992 | ............ | F02M 67/00 |
| JP | 09-320914 A | 12/1997 | | |
| JP | 2002118161 A | 4/2002 | | |
| JP | 2002-368061 A | 12/2002 | | |
| JP | 2005187967 A | 7/2005 | | |
| JP | 2007294938 A | 11/2007 | | |

(Continued)

*Primary Examiner* — James Keenan
(74) *Attorney, Agent, or Firm* — Nath, Goldberg & Meyer; Jerald L. Meyer

(57) ABSTRACT

A lid opening and closing device includes a table configured to mount a carrier thereon with a front surface of a carrier lid configured to face toward a conveying gateway, a gas injecting hole provided in an opposing surface portion and configured to supply a purge gas used in removing particles adhering to the carrier lid, an advancing/retreating mechanism configured to move the carrier placed on the table toward and away from the opposing surface portion, and a control unit configured to output a control signal such that a purge gas is supplied from the gas injecting hole to the carrier lid, wherein the carrier is positioned such that the distance between the opposing surface portion and the carrier lid is 5 mm or less and the carrier lid and the opposing surface portion are spaced apart from each other, and the carrier lid is subsequently removed from the carrier.

8 Claims, 13 Drawing Sheets

(56) References Cited

FOREIGN PATENT DOCUMENTS

| | | | |
|---|---|---|---|
| JP | 2008104929 A | 5/2008 | |
| JP | 2009018250 A | 1/2009 | |
| JP | 2010-56296 A | 3/2010 | |
| JP | 2010165741 A | 7/2010 | |
| WO | WO 2010131414 A1 * | 11/2010 | ............ H01L 21/673 |

* cited by examiner

LID OPENING AND CLOSING DEVICE

CROSS-REFERENCE TO RELATED APPLICATION

This application claims the benefit of Japanese Patent Application No. 2011-068399, filed on Mar. 25, 2011, in the Japan Patent Office, the disclosure of which is incorporated herein in its entirety by reference.

TECHNICAL FIELD

The present disclosure relates to a lid opening and closing device for opening and closing a lid that blocks a substrate takeout opening, which forms a part of a FOUP (Front Opening Unified Pod).

BACKGROUND

As one example of semiconductor manufacturing, there is available a vertical heat treatment apparatus for thermally treating, e.g., a plurality of semiconductor wafers (hereinafter referred to as wafers) in a batch-wise manner. The vertical heat treatment apparatus is installed in an air atmosphere. The vertical heat treatment apparatus includes a carrier conveying region in which a wafer-holding carrier called a FOUP is conveyed. The vertical heat treatment apparatus also includes a wafer conveying region in which wafers are transferred to a wafer boat as a substrate holding mechanism and are conveyed to a heat treatment furnace. A partition wall is formed between the carrier conveying region and the wafer conveying region. In order to prevent particles from adhering to the wafers during a heat treatment process, the cleanliness of the wafer conveying region is kept higher than that of the carrier conveying region.

A conveying gateway for the wafers is formed in the partition wall. The conveying gateway is opened and closed by an opening/closing door conforming to a FIMS (Front-Opening Interface Mechanical Standard). The opening/closing door is provided with a removal mechanism for removing a lid installed on the front surface of a carrier. In other words, the opening/closing door is required to open and close the lid to transfer the wafers between the inside of the carrier and the wafer conveying region, and to isolate the wafer conveying region from the carrier conveying region.

Semiconductor devices are highly functionalized and miniaturized, which tends to reduce the wiring line width and the design rule. It is therefore necessary to pay attention to particles even if the amount of the particles does not matter. In other words, there is a need to keep the wafer conveying region at a higher degree of cleanliness. From the viewpoint of reducing the manufacturing cost of semiconductor devices, it is advantageous to keep the apparatus installation environment, i.e., the carrier conveying region, at a low degree of cleanliness. However, if the degree of cleanliness in the carrier conveying region is low, it becomes easy for particles to adhere to a carrier. The opening/closing door arranged in the conveying gateway is opened toward the wafer conveying region while the lid of the carrier is held. Therefore, there is a possibility that the particles adhering to the lid may be taken into the wafer conveying region, thereby reducing the degree of cleanliness in the wafer conveying region.

In the related art, there is disclosed a device in which a nozzle for injecting a gas toward a lid of a carrier is installed at a partition wall to remove particles adhering to the lid. In light of the circumstances stated above, there exists a need for a device capable of more reliably removing particles adhering to a lid of a carrier.

SUMMARY

The present disclosure provides a technology capable of preventing particles existing in a FOUP conveying region from infiltrating into a substrate conveying region through a lid of a FOUP.

According to some embodiments of the present disclosure, there is provided a lid opening and closing device for a semiconductor manufacturing apparatus which includes: a partition wall configured to divide a carrier conveying region and a substrate conveying region, the partition wall having a conveying gateway with an edge portion; a carrier including a carrier body and a carrier lid configured to removably engage with the carrier body, the carrier body having a substrate takeout opening with an edge part, the carrier lid having an opening on the front surface thereof, the edge part of the substrate takeout opening of the carrier body configured to make contact with the edge portion of the conveying gateway; and an opening/closing door configured to open and close the conveying gateway, the opening/closing door including an opposing surface portion facing the carrier and a lid removal mechanism provided in the opposing surface portion, wherein the lid removal mechanism is configured to enter the carrier lid, to release engagement of the carrier lid with the carrier body, and to hold the carrier lid, the lid opening and closing device including: a table configured to mount the carrier thereon with a front surface of the carrier lid configured to face toward the conveying gateway; a gas injecting hole provided in the opposing surface portion and configured to supply a purge gas used in removing particles adhering to the carrier lid; an advancing/retreating mechanism configured to move the carrier placed on the table toward and away from the opposing surface portion; and a control unit configured to output a control signal such that a purge gas is supplied from the gas injecting hole to the carrier lid, wherein the carrier is configured to be positioned in an effective gas supply position where the distance between the opposing surface portion and the carrier lid is 5 mm or less and where the carrier lid and the opposing surface portion are spaced apart from each other, and the carrier lid is subsequently removed from the carrier.

According to some other embodiments of the present disclosure, there is provided a lid opening and closing device for a semiconductor manufacturing apparatus which includes: a partition wall configured to divide a carrier conveying region and a substrate conveying region, the partition wall having a conveying gateway with an edge portion; a carrier including a carrier body and a carrier lid configured to removably engage with the carrier body, the carrier body having a substrate takeout opening with an edge part, the carrier lid having an opening on the front surface thereof, the edge part of the substrate takeout opening of the carrier body configured to make contact with the edge portion of the conveying gateway; and an opening/closing door configured to open and close the conveying gateway, the opening/closing door including an opposing surface portion facing the carrier and a lid removal mechanism provided in the opposing surface portion, wherein the lid removal mechanism configured to enter the carrier lid, to release engagement of the carrier lid with the carrier body, and to hold the carrier lid, the lid opening and closing device including: a table configured to mount the carrier thereon with a front surface of the carrier lid configured to face toward the conveying gateway; a gas injecting hole provided in the opposing surface portion and configured to supply a purge gas used in removing particles adhering to the carrier lid; an advancing/retreating mechanism configured to move the carrier placed on the table toward and away from the opposing surface portion; and a first ionizer configured to ionize the purge gas injected from the gas injecting hole.

The term "FOUP" used herein is an abbreviation of Front Opening Unified Pod and refers to, in some embodiments, a carrier for conveying and preserving wafers of 300 mm in diameter. The substrates to be stored within the FOUP are not limited to the wafers as described and the diameter of the substrates is not limited to 300 mm. The mechanism for bringing a FOUP body and a FOUP lid into engagement with each other is not limited to the configuration in which a linear movement part is moved up and down by the rotation of a rotary part as described, but includes all the configurations in which engagement is released by a lid removal mechanism coming into the lid.

BRIEF DESCRIPTION OF THE DRAWINGS

The accompanying drawings, which are incorporated in and constitute a part of the specification, illustrate various embodiments of the present disclosure, and together with the general description given above and the detailed description of various embodiments given below, serve to explain the principles of the present disclosure.

DETAILED DESCRIPTION

First Embodiment

Figure 1:
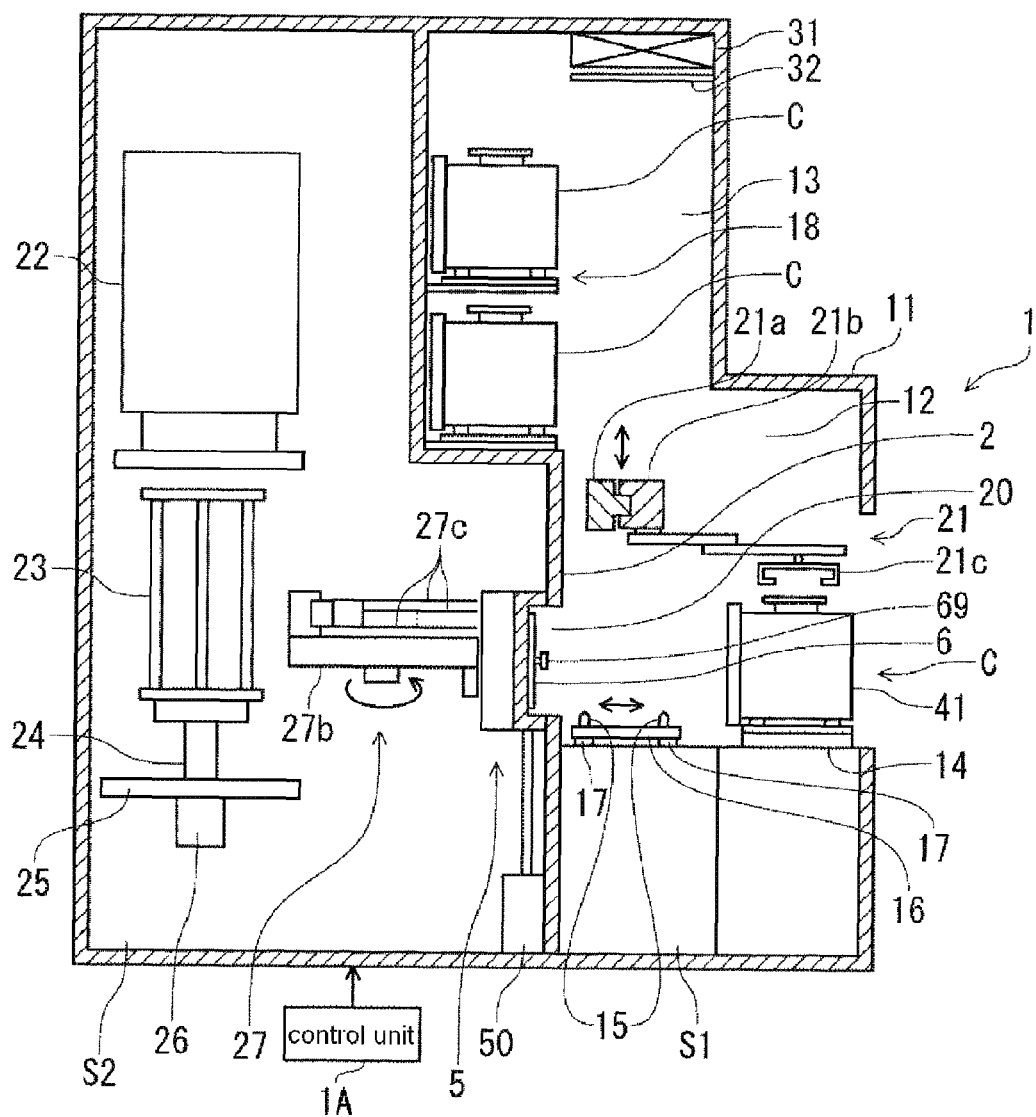
FIG. 1 is a vertical side sectional view of a vertical heat treatment apparatus employing a lid opening and closing device of the present disclosure.
Figure 2:
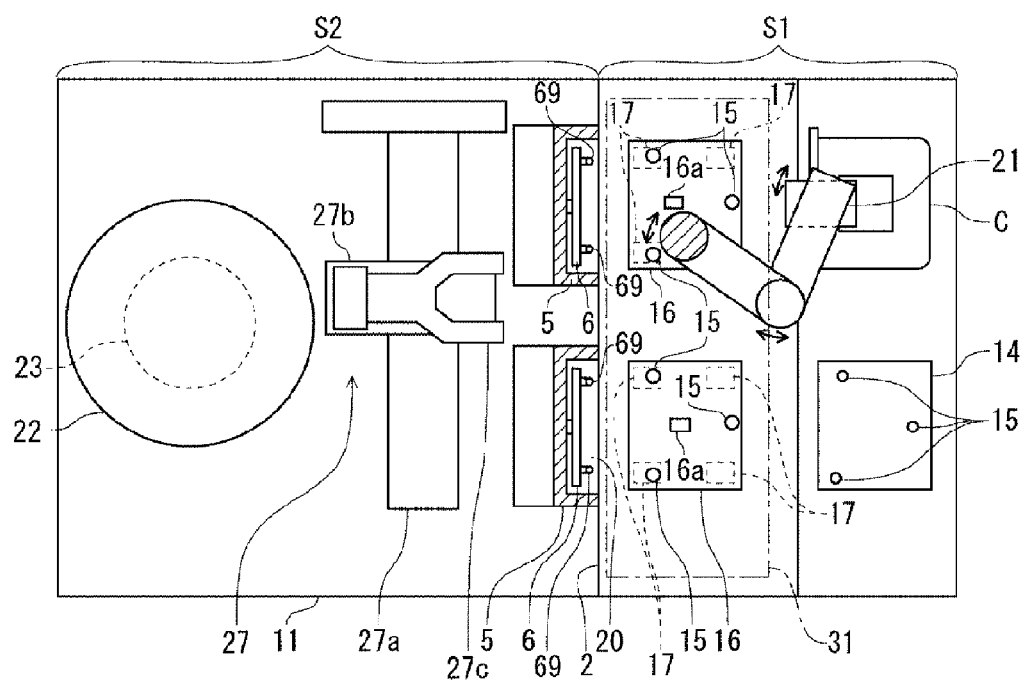
FIG. 2 is a plan view of the vertical heat treatment apparatus.

Description will now be made on a vertical heat treatment apparatus having a lid opening and closing device according to the present disclosure installed therein. FIG. 1 is a vertical side sectional view of a vertical heat treatment apparatus 1. FIG. 2 is a plan view of the vertical heat treatment apparatus 1. In the figures, reference numeral 11 designates a housing that makes up an outer shell of the vertical heat treatment apparatus 1. The internal space of the housing 11 is divided into a carrier conveying region S1 in which a carrier C as a container for storing wafers W to be processed is carried into and out of the vertical heat treatment apparatus and a wafer conveying region S2 as a transferring region in which the wafers W stored within the carrier C are conveyed and carried into a heat treatment furnace to be set forth later. The carrier C is the FOUP stated above.

The carrier conveying region S1 and the wafer conveying region S2 is divided by a partition wall 2. The carrier conveying region S1 is kept in an air atmosphere. The wafer conveying region S2, on the other hand, is kept in an inert gas atmosphere, e.g., nitrogen ($N_2$) gas atmosphere, in order to prevent formation of oxide films on the wafers W being carried in. The wafer conveying region S2 is higher in cleanliness but lower in oxygen concentration than the carrier conveying region S1. In the following description, the arranging direction of the carrier conveying region S1 and the wafer conveying region S2 will be defined as the front-rear direction of the vertical heat treatment apparatus 1.

Description will be made on the carrier conveying region S1. The carrier conveying region S1 includes a first conveying region 12 and a second conveying region 13 positioned at the rear side of the first conveying region 12 (at the side of the wafer conveying region S2). Two first tables 14 for respectively mounting the carriers C thereon are installed at the left and right sides of the first conveying region 12. Pins 15 for positioning the carrier C are installed, e.g., at three points, on the loading surface of each of the first tables 14.

Two second tables 16 are arranged at the left and right sides of the second conveying region 13, as shown in FIG. 2, so that the second tables 16 can be arranged in the front-rear direction with respect to the first tables 14. Each of the second tables 16 can be moved in the front-rear direction by an advancing/retreating mechanism 17. Each of the second tables 16 conveys a carrier C between a transfer position in which the wafers W are transferred from the carrier C to the wafer conveying region S2 and a reception position in which the carrier C is received from a carrier conveying mechanism 21 to be described later. In the same manner as the first tables 14, pins 15 for positioning the carrier C are installed at three points on the loading surface of each of the second tables 16. A hook 16a for fixing the carrier C is installed on the loading surface of each of the second tables 16. A carrier storage part 18 for storing the carrier C is provided at the upper side of the second conveying region 13. The carrier storage part 18 is formed of two racks, each of which can support two carriers C side by side in the left-right direction.

In the second conveying region 13, there is installed a carrier conveying mechanism 21 for conveying the carrier C between the first tables 14, the second tables 16 and the carrier storage part 18. The carrier conveying mechanism 21 includes a guide part 21a extending in the left-right direction and capable of moving up and down, a moving part 21b movable in the left-right direction under the guidance of the guide part 21a and an articulated arm 21c installed at the moving part 21b and arranged to hold and horizontally convey the carrier C.

A filter unit 31 including a HEPA filter or a ULPA filter is provided in the ceiling portion of the second conveying region 13. Air is purified by the filter unit 31 and is supplied downward. An ionizer 32 is provided below the filter unit 31 to ionize the air supplied from the filter unit 31. The ionized air is supplied toward the second tables 16.

Figure 3:
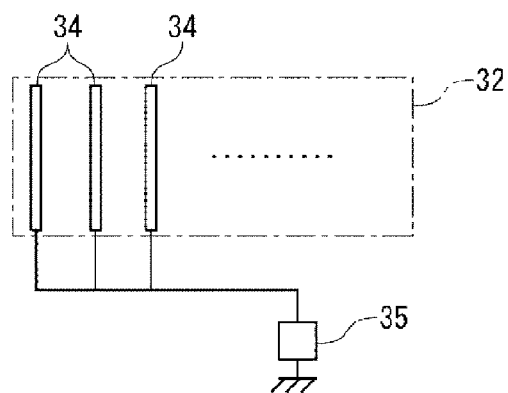
FIG. 3 is a top view of an ionizer installed at the vertical heat treatment apparatus.

FIG. 3 is a top view of the ionizer 32. The ionizer 32 is formed of, e.g., a plurality of horizontally-arranged rod-shaped electrodes 34. The air is supplied downward through between the electrodes 34. An alternating current voltage is applied by a power source 35 to the electrodes 34. The air makes contact with the electric fields formed around the electrodes 34 to which the alternating current voltage is applied. Thus the air is ionized, thereby comprising positive air ions and negative air ions. When making contact with an electrically-charged object, the ionized air repels the ions having the same polarity but attracts the ions having the opposite polarity, as a result of which electricity is removed from the electrically-charged object.

In the partition wall 2, there is provided a conveying gateway 20 for the wafers W through which the carrier conveying region S1 and the wafer conveying region S2 communicate with each other. An opening/closing door 5 for blocking the conveying gateway 20 from the side of the wafer conveying region S2 is installed at the conveying gateway 20. A drive mechanism 50 is connected to the opening/closing door 5. The opening/closing door 5 can be moved by the drive mechanism 50 in the front-rear direction and the up-down direction, thereby opening and closing the conveying gateway 20. Configurations around the opening/closing door 5 and the conveying gateway 20 will be described later in more detail.

A heat treatment furnace 22 of a vertical-type having an open lower end as a furnace throat is installed at the wafer conveying region S2. At the lower side of the heat treatment furnace 22, a wafer boat 23 for holding a plurality of wafers W in a shelf-like manner is loaded on a cap 25 through a heat insulating portion 24. The cap 25 is supported on a lift mechanism 26. The wafer boat 23 is carried into or out of the heat treatment furnace 22 by the lift mechanism 26.

A wafer conveying mechanism 27 is installed between the wafer boat 23 and the conveying gateway 20 of the partition wall 2. The wafer conveying mechanism 27 includes a guide mechanism 27a extending in the left-right direction, a moving body 27b movable along the guide mechanism 27a and rotatable about a vertical axis, and five retractable arms 27c attached to the moving body 27b. The wafer conveying mechanism 27 conveys the wafers W between the wafer boat 23 and the carrier C on the second tables 16.

Figure 4:
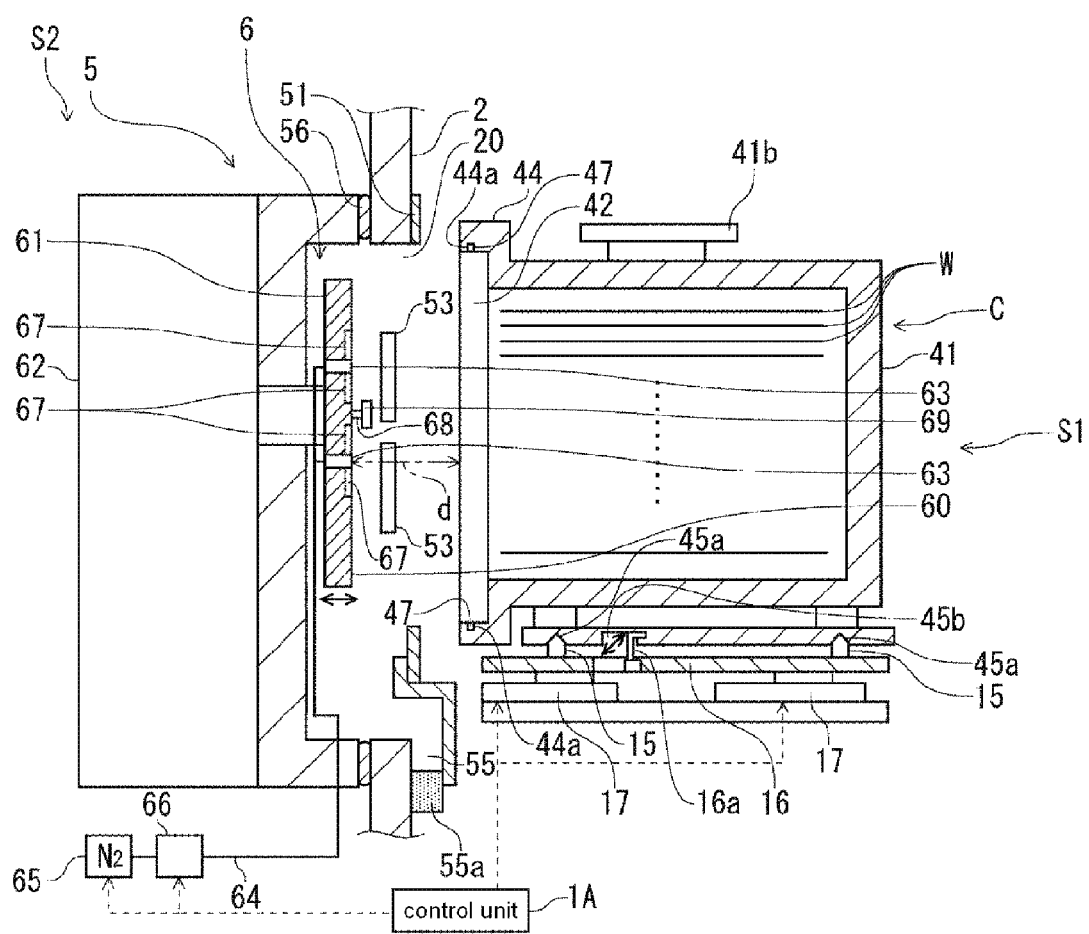
FIG. 4 is a vertical side sectional view of a carrier and an opening/closing door installed in the vertical heat treatment apparatus.
Figure 5:
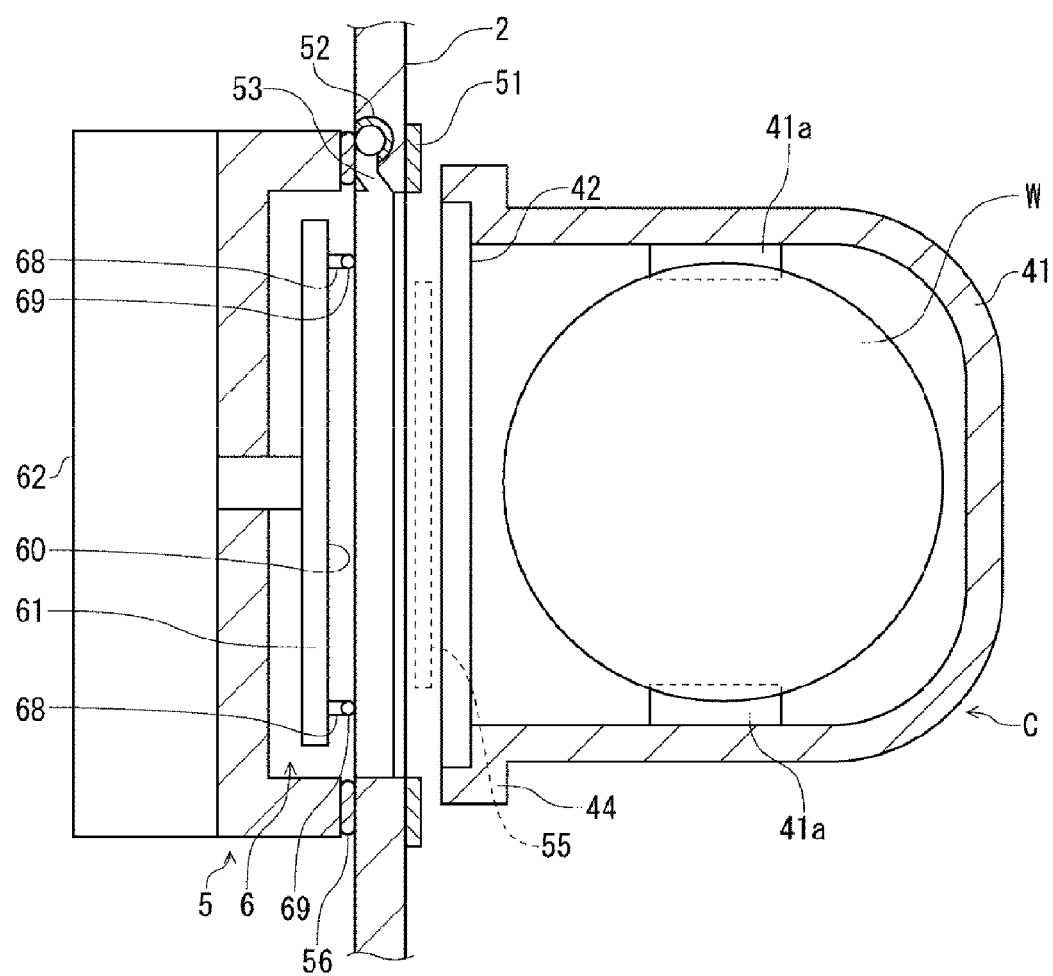
FIG. 5 is a horizontal top sectional view of the carrier and the opening/closing door.
Figure 6:
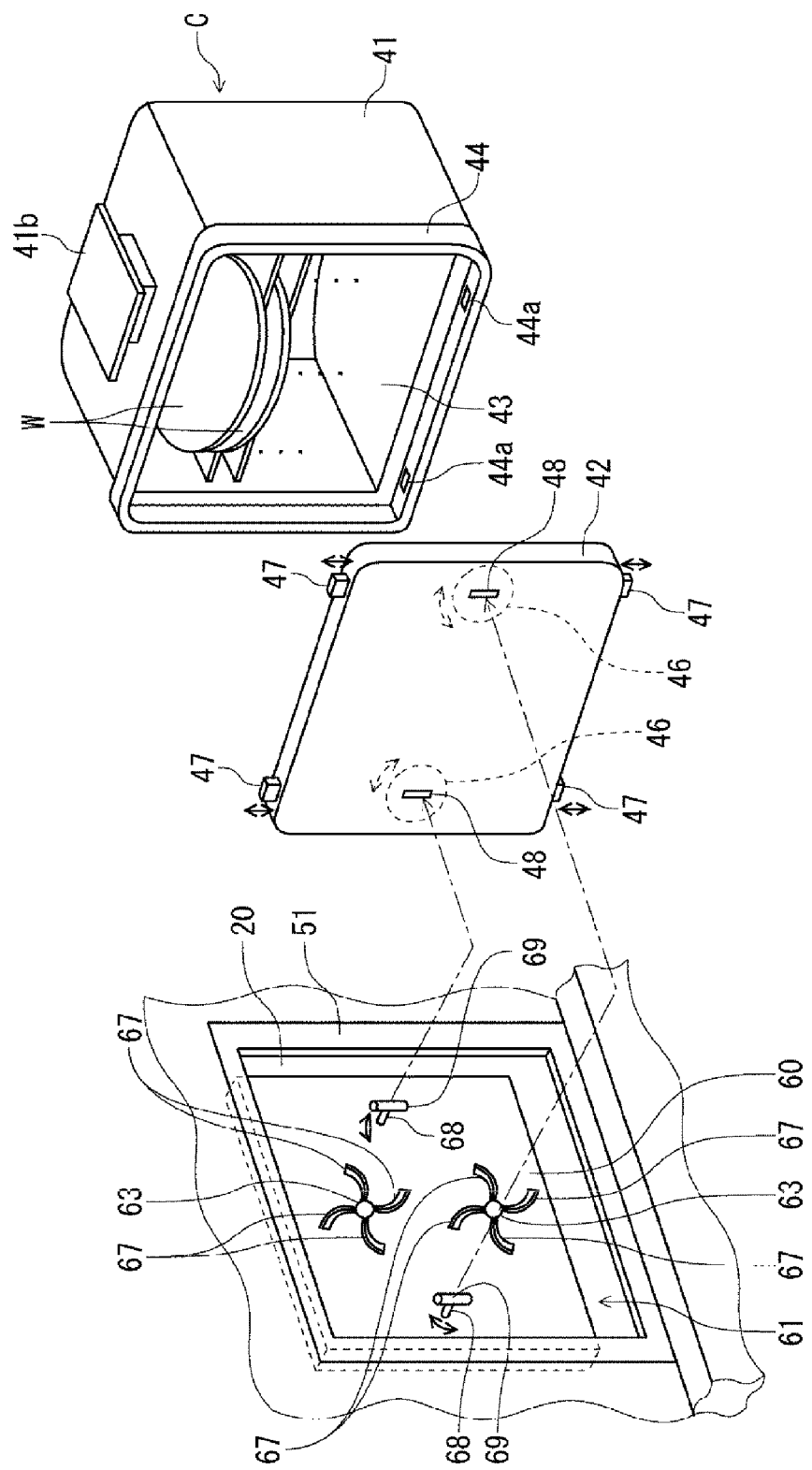
FIG. 6 is a perspective view of the carrier and the conveying gateway in which the opening/closing door is installed.

FIGS. 4 and 5 are vertical and horizontal sectional views of the carrier C, the conveying gateway 20 for the wafers W and the opening/closing door 5, respectively. FIG. 6 is a perspective view of the conveying gateway 20 and the carrier C. The carrier C will be described with reference to FIGS. 4 through 6.

The carrier C includes a carrier body 41 as a container body and a lid 42. At the left and right sides within the carrier body 41, support portions 41a for supporting the peripheral edge portions of the rear surfaces of the wafers W are installed as multiple stages. A takeout opening 43 for the wafers W is formed on the front surface of the carrier body 41. In the figures, reference numeral 44 designates an edge part of the takeout opening 43. Engaging grooves 44a are formed in the left and right portions of the upper and lower regions of the inner circumferential surface of the edge part 44.

In the upper portion of the carrier body 41, there is installed a grip portion 41b gripped by the carrier conveying mechanism 21 for the conveyance of the carrier C. As shown in FIG. 4, a plurality of recess portions 45a and a groove portion 45b are formed in the lower portion of the carrier body 41. The recess portions 45a are fitted to the pins 15 of the first table 14 and the second table 16. The groove portion 45b engages with the hook 16a of the second table 16, whereby the carrier body 41 is fixed to the second table 16.

The lid 42 of the carrier C will now be described in detail. Rotary parts 46 are installed at the left and right sides within the lid 42. Linear movement parts 47 extending in the vertical direction are installed at the upper and lower sides of each of the rotary parts 46. The linear movement parts 47 are moved up and down as the rotary parts 46 move in rotation. The linear movement parts 47 are switched between a state in which the tip ends thereof protrude from the side surfaces of the lid 42 and a state in which the tip ends thereof are retracted into the lid 42. FIG. 6 shows the tip ends of the linear movement parts 47 kept in a protruding state. The tip ends of the linear movement parts 47 engages with the engaging grooves 44a of the carrier body 41, whereby the lid 42 is brought into engagement with the carrier body 41. Openings 48 through which keys 69, to be described later, are inserted into the lid 42 are formed on the front surface of the lid 42.

Subsequently, description will be made on the opening/closing door 5 and the conveying gateway 20 of the wafers W. In the edge portion of the conveying gateway 20 at the side of the carrier conveying region 51, a seal member 51 is installed at such a position as to make contact with the edge part 44 of the carrier body 41. As shown in FIG. 5, an $N_2$ gas supply pipe 52 is vertically installed in one side edge portion of the conveying gateway 20. The $N_2$ gas supply pipe 52 is provided with upper and lower gas supply holes 53. The gas supply holes 53 is configured to supply an $N_2$ gas into a closed space surrounded by the carrier C and the opening/closing door 5 when the carrier C is moved into a position (or a transfer position), in which the edge part 44 makes contact with the seal member 51, to transfer the wafers W between the carrier C and the wafer conveying region S2. A horizontally-extending exhaust port 55 is installed at the lower end portion of the conveying gateway 20. Reference numeral 55a designates a porous body installed in the exhaust port 55 to restrain unbalanced exhaust in the horizontal direction.

The opening/closing door 5 is formed into a box-like shape with the peripheral edge portion thereof bent toward the carrier conveying region 51. A seal member 56 is installed at the edge portion of the opening/closing door 5. The opening/closing door 5 makes contact with the edge portion of the conveying gateway 20 by way of the seal member 56.

A removal mechanism 6 for removing the lid 42 is installed at the surface of the opening/closing door 5 facing the carrier conveying region 51. The removal mechanism 6 includes an opposing plate 61 and an advancing/retreating mechanism 62 for moving the opposing plate 61 in the front-rear direction. The opposing plate 61 includes an opposing surface portion 60 facing the front surface of the lid 42 placed on the second tables 16. As shown in FIG. 6, the opposing surface portion 60 includes gas injecting holes 63 formed, e.g., in the upper and lower horizontal center positions thereof. One end of a pipeline 64 is connected to the gas injecting holes 63. The other end of the pipeline 64 is connected to an $N_2$ gas supply mechanism 65. The $N_2$ gas supply mechanism 65 is configured to feed an $N_2$ gas as a purge gas toward the downstream side of the pipeline 64. An ionizer 66 is arranged in the pipeline 64. Just like the ionizer 32 set forth above, the ionizer 66 includes electrodes. The $N_2$ gas is exposed to and ionized by the electric fields generated around the electrodes and is injected from the gas injecting holes 63. In FIG. 4, reference numeral "d" denotes the distance between the opposing surface portion 60 and the front surface of the lid 42. As will be described later, if the carrier C comes closer to the removal mechanism 6 and if the distance d becomes 5 mm or less, the $N_2$ gas is injected from the gas injecting holes 63.

Figure 7:
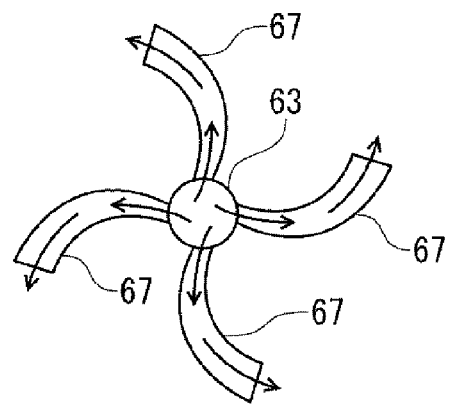
FIG. 7 is a plan view of a gas injecting hole installed at the opening/closing door.

Spiral grooves 67 spirally extending outward from each of the gas injecting holes 63 are formed in the opposing surface portion 60. As an example, four spiral grooves 67 are formed along the circumferential direction of each of the gas injecting holes 63. Each of the spiral grooves 67 spirally extends in the left direction. FIG. 7 is a front view of the gas injecting holes 63 and the spiral grooves 67. When the $N_2$ gas is injected from the gas injecting holes 63 with the lid 42 of the carrier C and the opposing surface portion 60 facing toward each other, the $N_2$ gas is guided by the spiral grooves 67 as indicated by arrows in FIG. 7, whereby a swirling flow is generated about the gas injecting holes 63. The arrangement and number of the gas injecting holes 63 is not limited to this example. For example, a single gas injecting hole may be installed at the center of the opposing surface portion 60. The spiral grooves 67 may be formed to spirally extend in the right direction.

Referring back to FIGS. 4 through 6, a pair of rod-shaped connecting parts 68 extends from the opposing surface portion 60 in the thickness direction of the latter. Keys (latch pins) 69 are installed at the tip ends of the connecting parts 68. Each connecting part 68 may be rotated about its axis to thereby rotate the keys 69. The keys 69 are engageable with the rotary parts 46 of the lid 42 and are capable of rotating the rotary parts 46. The shape of the keys 69 is not limited to the circular column shape shown in the drawings because the keys 69 need only engage with the rotary parts 46. The keys 69 may have, e.g., a polygonal column shape. The edge portions of the circular columnar keys or the polygonal columnar keys may be formed into a round shape.

In the vertical heat treatment apparatus 1, there is provided a control unit 1A comprising for example, a computer. The control unit 1A includes a data processing comprising a CPU, a program, and a memory. Commands (individual steps) are included in the program so that the control unit 1A can send control signals to the respective parts of the vertical heat treatment apparatus 1 to perform the respective processing steps to be set forth below. The operations of conveying the carrier C, advancing or retreating the second tables 16, advancing or retreating the removal mechanism 6, conveying the wafers W, opening or closing the lid 42, opening or closing the opening/closing door 5 and supplying an $N_2$ gas to the lid 42 are controlled by the control signals. Thus the wafers W are conveyed and processed in the manner described later. The program is stored in a computer-readable storage medium, e.g., a flexible disk, a compact disk, a hard disk, a magneto-optical disk or a memory card and is installed in the control unit 1A.

Next, description will be made on the operation of the foregoing embodiment. An air is supplied downward from the filter unit 31. The air is ionized by the ionizer 32 and is supplied further downward. A descending air flow is generated in the second conveying region 13 in which the second tables 16 are installed. By virtue of the descending air flow, electricity is removed from the particles existing in the second conveying region 13. This weakens the adhering force of the particles to the carrier C.

The carrier C is placed on the first table 14 by an automatic conveying robot (not shown) that moves along the ceiling portion of a clean room. Subsequently, the carrier C is conveyed to the second table 16 by the carrier conveying mechanism 21 and is fixed to the second table 16 by the hook 16a.

Figure 8:
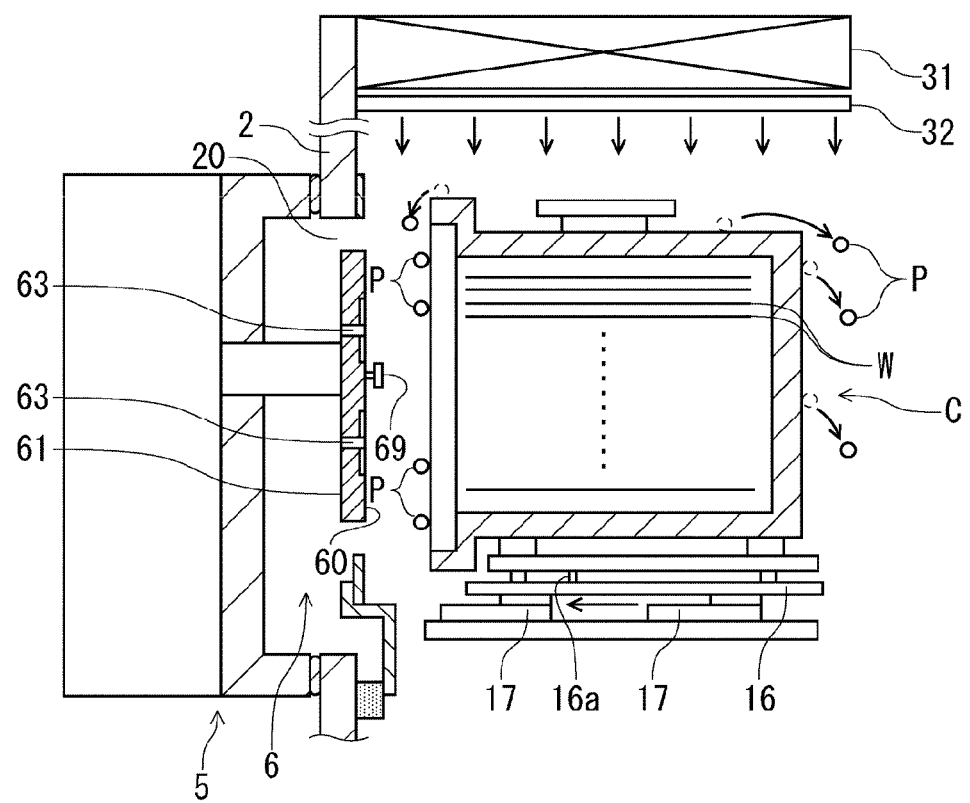
FIG. 8 is a process view illustrating a step of removing the lid.
Figure 9:
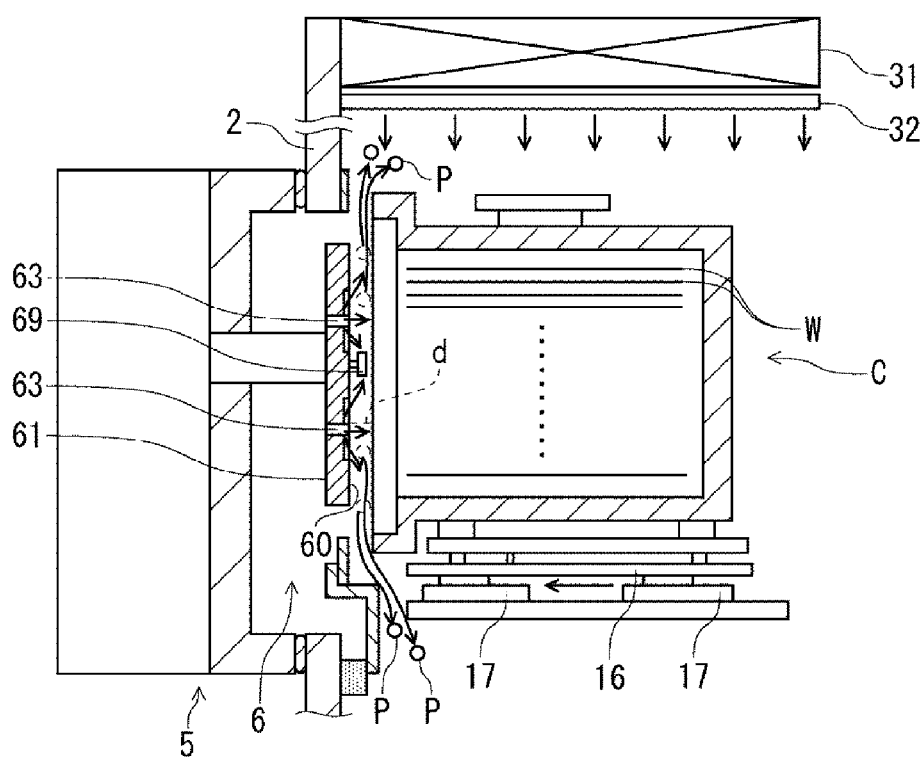
FIG. 9 is a process view illustrating another step of removing the lid.

The second table 16 is moved toward the conveying gateway 20 of the partition wall 2 by the advancing/retreating mechanism 17. The carrier C is moved while being exposed to the descending air flow. Electricity is removed from the particles P adhering to the carrier C by the descending air flow. Thus the adhering force of the particles P to the carrier C is weakened. The particles P are moved together with the descending air flow and are removed from the carrier C (see FIG. 8). If the distance d between the opposing surface portion 60 and the lid 42 of the carrier C becomes equal to 5 mm, the moving speed of the second table 16 is reduced and the $N_2$ gas ionized by the ionizer 66 is injected from the gas injecting holes 63 toward the lid 42. The $N_2$ gas injected from the gas injecting holes 63 flows along a gap between the front surface of the lid 42 and the opposing surface portion 60 of the removal mechanism 6, thereby removing electricity from the particles P adhering to the front surface of the lid 42 and weakening the adhering force of the particles P to the lid 42. The particles P having a weakened adhering force are washed away from the lid 42 by the $N_2$ gas (see FIG. 9).

Figure 10:
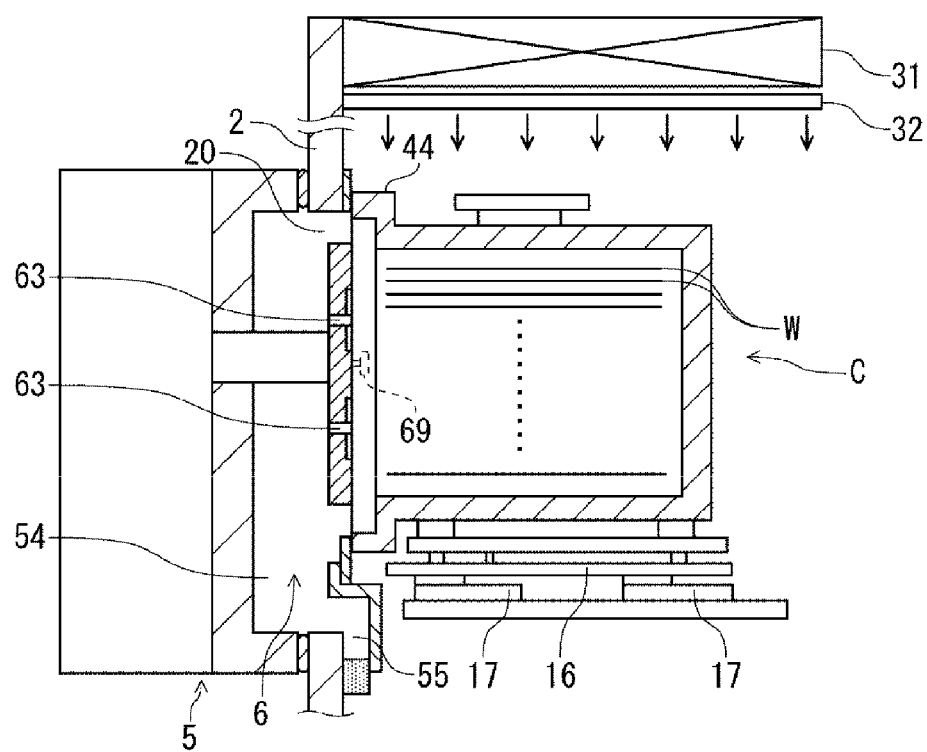
FIG. 10 is a process view illustrating a further step of removing the lid.

The carrier C continues to move forward and the keys 69 of the removal mechanism 6 enter the lid 42 through the openings 48 of the lid 42. If the distance d becomes equal to a specified dimension, the injection of the $N_2$ gas from the gas injecting holes 63 is stopped. The carrier C is moved forward into a transfer position where the wafers W are transferred. The edge part 44 of the carrier C comes into contact with the seal member 51 around the conveying gateway 20 of the partition wall 2. A closed space 54 is formed between the carrier C and the opening/closing door 5. The keys 69 of the removal mechanism 6 come into engagement with the rotary parts 46 of the lid 42 (see FIG. 10).

Figure 11:
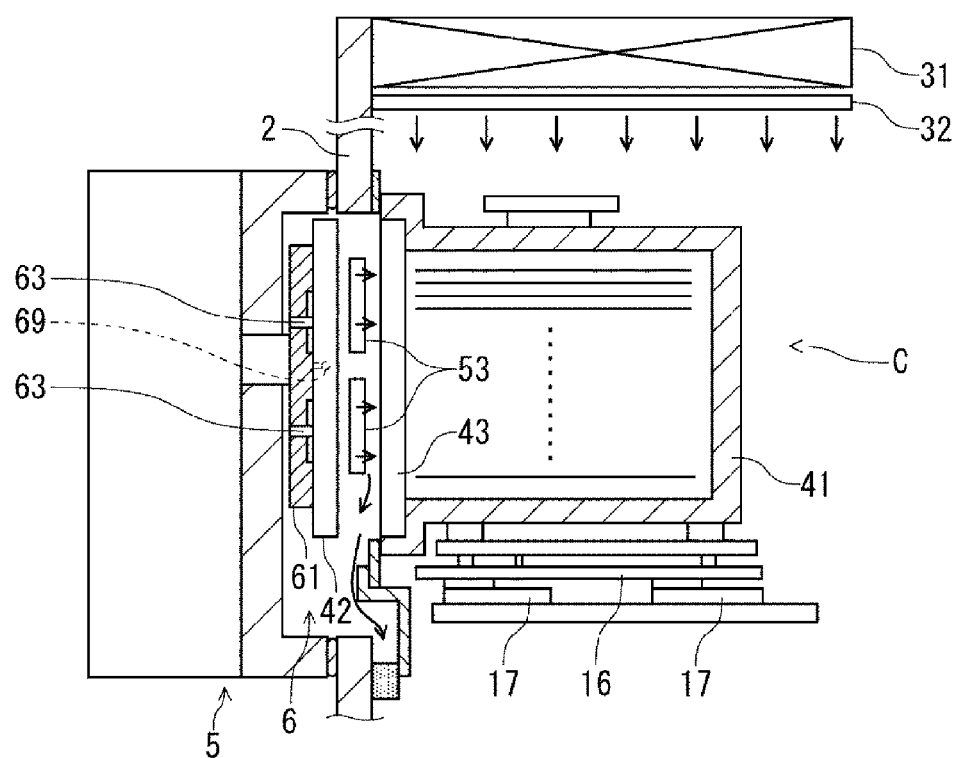
FIG. 11 is a process view illustrating a still further step of removing the lid.

The air existing in the closed space 54 is discharged from the exhaust port 55. Concurrently, the $N_2$ gas is supplied from the gas supply holes 53 into the closed space 54, thereby generating an $N_2$ gas atmosphere in the closed space 54. The keys 69 are rotated 90 degrees. The lid 42 and the carrier body 41 are disengaged from each other and the lid 42 is held by the keys 69. The opposing plate 61 is moved back toward the opening/closing door 5 in a state that the keys 69 holds the lid 42. The takeout opening 43 for the wafers W of the carrier body 41 is opened (see FIG. 11).

Figure 12:
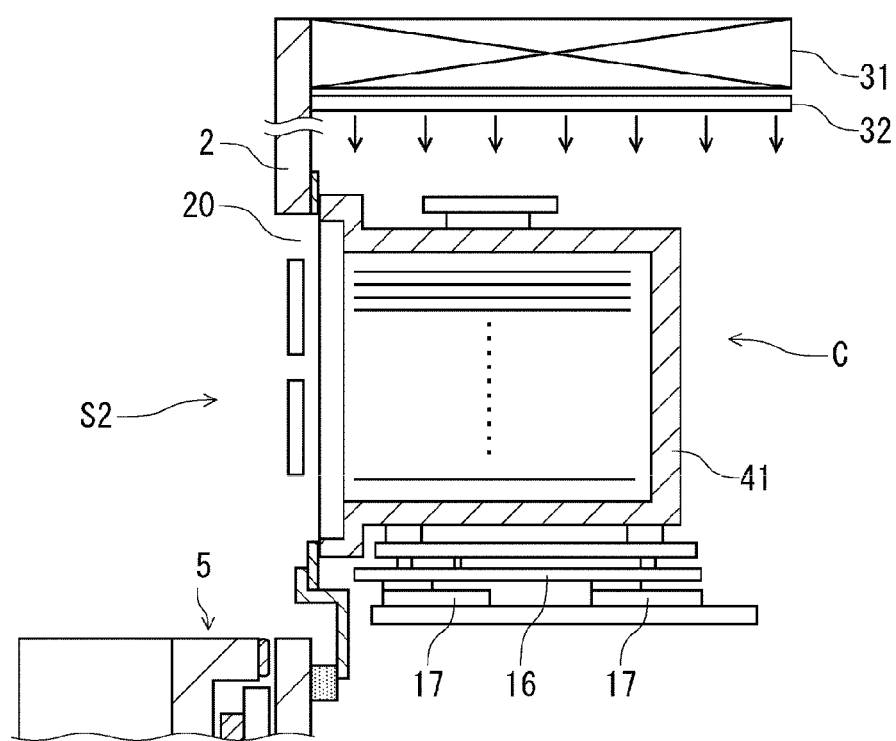
FIG. 12 is a process view illustrating a yet still further step of removing the lid.

The opening/closing door 5 is retreated, moved down and removed from the conveying gateway 20. The inside of the carrier C is opened to the wafer conveying region S2 (see FIG. 12). The wafers W stored within the carrier C are taken out one after another by the wafer conveying mechanism 27 and are transferred to the wafer boat 23. When all the wafers W are taken out from the carrier C, the lid 42 of the carrier C is closed through the operations opposite to the operations set forth above and is fixed to the carrier body 41. Thereafter, the second table 16 is retreated to move the carrier C away from the partition wall 2. The carrier C is conveyed to the carrier storage part 18 by the carrier conveying mechanism 21 and is temporarily stored in the carrier storage part 18. On the other hand, the wafer boat 23 holding the wafers W is carried into the heat treatment furnace 22. The wafers W are subjected to heat treatments, e.g., chemical vapor deposition, annealing and oxidizing. Thereafter, the processed wafers W are returned to the carrier C. At this time, the lid 42 is opened in the same order as applied when the wafers W are taken out from the carrier C.

The vertical heat treatment apparatus 1 includes the opposing plate 61 installed in the opening/closing door 5 for opening and closing the conveying gateway 20 of the partition wall 2 and facing the front surface of the lid 42 of the carrier C. Gas injecting holes 63 are formed in the opposing surface portion 60 of the opposing plate 61. The $N_2$ gas may be injected from the gas injecting holes 63 by, for example, setting the distance d between the opposing surface portion 60 and the lid 42 equal to 5 mm. By adjusting the distance d in this manner, it is possible to increase the flow velocity of the $N_2$ gas and to reliably remove the particles adhering to the lid 42 as described later. Accordingly, it is possible to restrain the particles from infiltrating the carrier conveying region S1 into the wafer conveying region S2 through the lid 42. It will be appreciated that the distance d is not limited to 5 mm but may be equal to or less than 5 mm.

Since the $N_2$ gas is ionized by the ionizer 66, it is possible to more reliably remove the particles adhering to the lid 42. An $N_2$ gas flow moving on a spiral course, when seen in the thickness direction of the opposing plate 61, is formed by the spiral grooves 67 provided in the opposing surface portion 60. The wind pressure acting on the particles becomes greater due to the formation of the $N_2$ gas flow. It is therefore possible to increase the removal rate of the particles adhering to the lid 42. Since a descending air flow formed of the ionized $N_2$ gas is supplied to the carrier C, it is possible to restrain the particles from adhering to the carrier C and to increase the removal rate of the particles from the carrier C. This makes it possible to more reliably restrain the particles from infiltrating into the wafer conveying region S2.

The moving speed of the second table 16 may be increased until the second table 16 reaches a position where the $N_2$ gas is injected from the gas injecting holes 63 and the moving speed of the second table 16 may be decreased when the carrier C is further moved forward from the position noted just above. Thus the lid 42 is exposed to the $N_2$ gas for a sufficient time and the particles are prevented from staying in the lid 42. It is also possible to reduce the time required for the carrier C to reach the transfer position of the wafers where the carrier C forms the closed space 54, thereby restraining a decrease in throughput. In the embodiment described above, the moving speed of the second table 16 may be reduced when the $N_2$ gas is injected from the gas injecting holes 63. Instead of reducing the moving speed of the second table 16, it may be possible to stop the advancing movement of the second table 16. In other words, the $N_2$ gas may be continuously supplied with the advancing movement of the second table 16 stopped, and the second table 16 may be moved forward after the supply of the $N_2$ gas is stopped.

Figure 13:
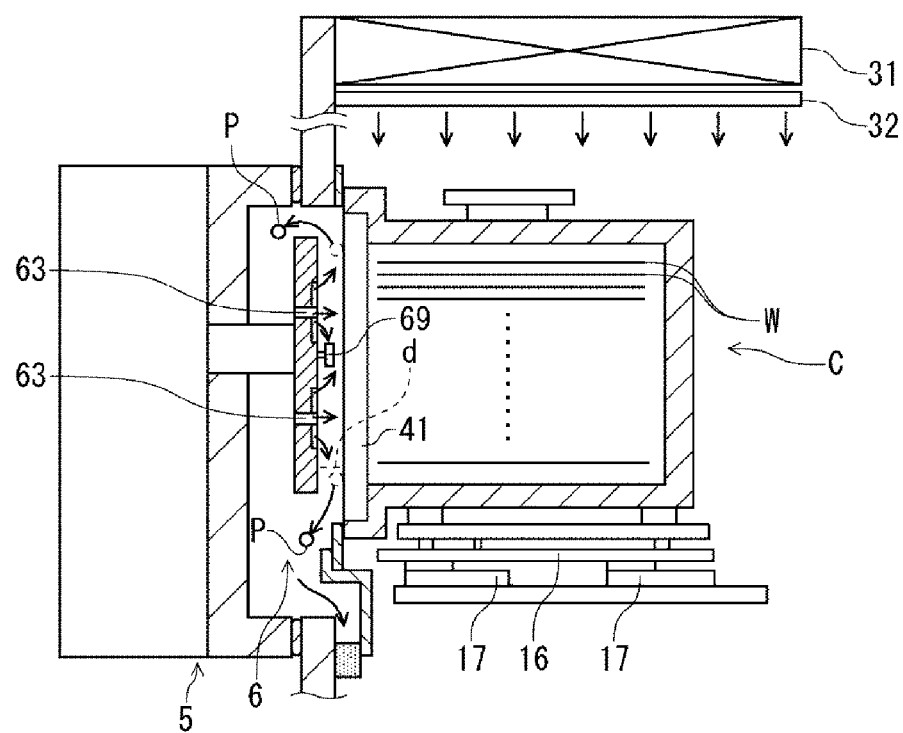
FIG. 13 is an explanatory view illustrating a step of removing another lid.

In the examples described above, the $N_2$ gas may be injected from the gas injecting holes 63 when the carrier C is moved forward. Alternatively, the injection of the $N_2$ gas may be performed when the opposing plate 61 is moved forward. For example, as shown in FIG. 13, the carrier C is first moved into the transfer position. Then, the opposing plate 61 is moved toward the carrier C. The $N_2$ gas is injected when the distance d becomes equal to 5 mm or less. The particles P removed from the lid 42 are discharged through the exhaust port 55. In this case, just like the examples described above, the advancing speed of the opposing plate 61 may be increased before starting the supply of the $N_2$ gas and is decreased after starting the supply of the $N_2$ gas. This makes it possible to increase the throughput and the removal rate of the particles. In this case, the supply of the $N_2$ gas may be performed by first stopping the advancing movement of the opposing plate 61 instead of reducing the moving speed.

While various embodiments have been described in which the objects to be processed are semiconductor wafers, the objects to be processed are not limited to the semiconductor wafers, and may be other materials such as, but not limited to, glass substrates or LCD substrates. In addition, the opening/closing door 5 and the partition wall 2 may be configured not only to divide the air atmosphere and the inert gas atmosphere but also to divide, e.g., regions differing in humidity from each other. Moreover, the purge gas injected from the gas injecting holes 63 is not limited to the $N_2$ gas but may be an air or other inert gases such as an argon gas.

<Evaluation Test 1>

Figure 14:
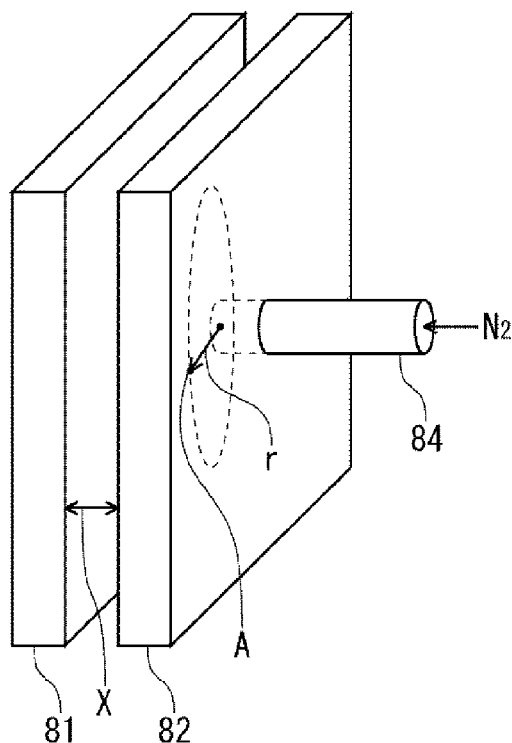
FIG. 14 is a perspective view showing a test device for evaluation tests.
Figure 15:
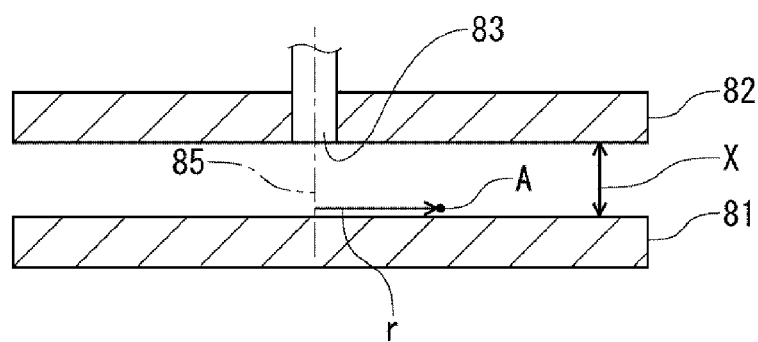
FIG. 15 is a horizontal top sectional view of the test device.

Description will now be made on evaluation test 1 in relation to the present disclosure. As shown in FIGS. 14 and 15, two plates 81 and 82 are arranged to face each other. An $N_2$ gas injecting hole 83 is formed at the center of the plate 82 so that an $N_2$ gas fed from a gas supply pipe 84 can be supplied in the plate thickness direction. In the figures, reference numeral "X" designates the gap between the plates 81 and 82. A measuring point A may be set on the surface of the plate 81. The wind velocity at the measuring point A was measured while changing the size of the gap X and the flow rate of the $N_2$ gas injected from the injecting hole 83. In the figures, reference numeral "r" designates the distance between the center 85 of the injecting hole 83 and the measuring point A. In evaluation test 1, the distance r is set equal to 150 mm. The flow rates of the $N_2$ gas are set equal to 10 slm (L/min), 50 slm and 100 slm, respectively.

Figure 16:
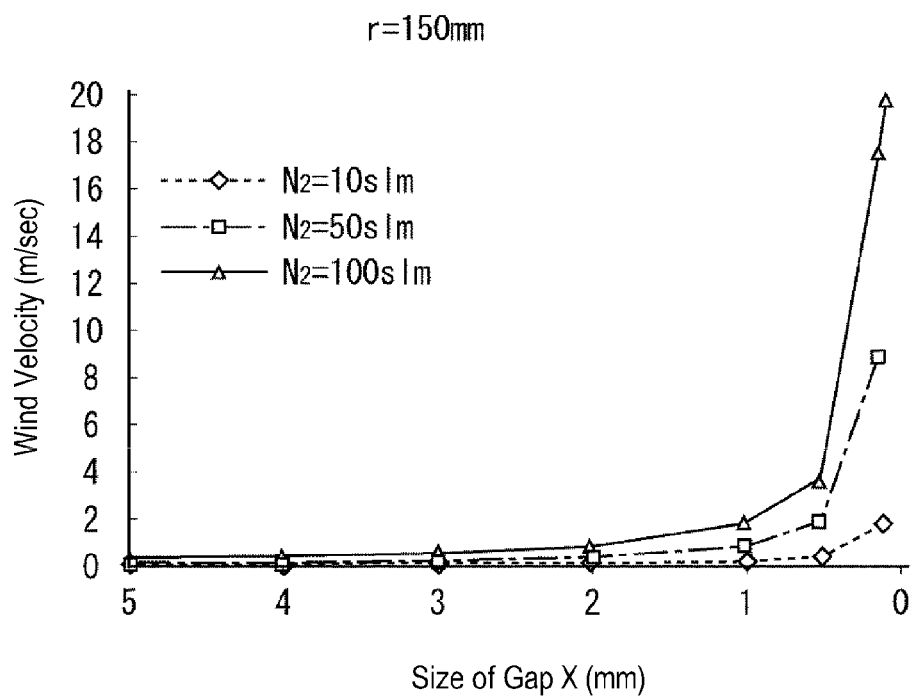
FIG. 16 is a graph illustrating the results of evaluation tests.

FIG. 16 is a graph showing the test results of the above parameters. In the graph, the vertical axis indicates the wind velocity (m/sec) at the measuring point A and the horizontal axis indicates the size of the gap X (mm) In case where the flow rate of the $N_2$ gas is any one of 10 slm, 50 slm and 100 slm, the wind velocity is decreased as the gap X becomes greater. The wind velocity is nearly zero when the gap X is 5 mm. If the gap X exceeds 5 mm, the wind velocity becomes nearly zero. This results in a reduced particle removing capacity when applied to the one or more of foregoing embodiments. Accordingly, it can be appreciated that, as described in respect of one or more of the foregoing embodiments, the distance between the lid 42 and the opposing surface portion 60 may be kept 5 mm or less. Regardless of the flow rate of the $N_2$ gas, the increasing rate of the wind velocity may grow higher if the gap X becomes 1 mm or less. In some embodiments, it may be therefore effective if the $N_2$ gas is injected from the gas injecting holes 63 when the distance d is equal to or less than 1 mm.

An air shower for injecting an air toward the objects carried into a clean room to remove particles may be designed to have an air flow velocity of 20 to 30 msec. In the measuring range of this illustration, the wind velocity may become 20 msec when the flow rate of the $N_2$ gas is set equal to 100 slm and when the gap X is nearly 0 mm. In order to obtain the same performance as that of the air shower, it may be effective in some embodiments to set the flow rate of the $N_2$ gas injected from the gas injecting holes 63 equal to 100 slm or more.

<Evaluation Test 2>

Using the same device as used in evaluation test 1, the wind velocity may be measured by changing the measuring point A, namely the distance r. The size of the gap X was set equal to 1 mm. As in evaluation test 1, the flow rates of the $N_2$ gas were set equal to 10 slm, 50 slm and 100 slm, respectively.

Figure 17:
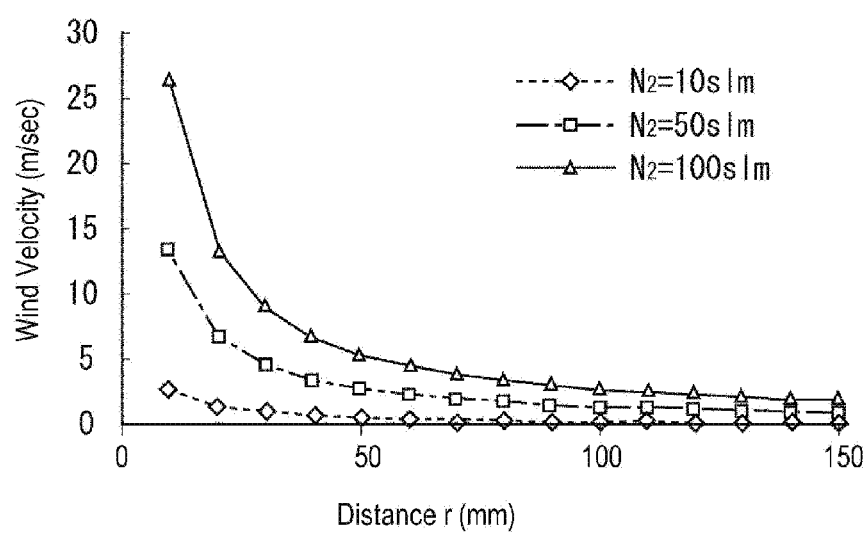
FIG. 17 is another graph illustrating the results of evaluation tests.

FIG. 17 is a graph showing the test results based on the above parameters. In the graph, the vertical axis indicates the wind velocity (m/sec) at the measuring point A and the horizontal axis indicates the distance r (mm) As shown in the graph, the difference in wind velocity between the respective flow rates grows larger as the distance r becomes smaller. The difference in wind velocity between the respective flow rates grows smaller and gradually approaches to zero as the distance r becomes larger. In order to reliably remove particles, it is preferred that a plurality of gas injecting holes 63 be provided in the opposing plate 61.

In one lid opening and closing device according to the present disclosure, the gas injecting hole may be installed at the opposing surface portion facing the carrier of the opening/closing door for opening and closing the conveying gateway of the partition wall. The purge gas may be injected from the gas injecting hole by controlling the distance between the opposing surface portion and the lid of the carrier to become 5 mm or less. Thus, the velocity of the air flow formed between the lid and the opposing surface portion may grow higher, thereby increasing the removal rate of particles adhering to the lid. As a result, it is possible to restrain the particles from infiltrating into the atmosphere of the substrate conveying region. In another lid opening and closing device according to the present disclosure, the purge gas ionized by the ionizer is supplied from the gas injecting hole. This makes it easy to remove the particles. Consequently, it is possible to restrain the particles from infiltrating into the atmosphere of the substrate conveying region.

While various embodiments have been described, these embodiments have been presented by way of example only, and are not intended to limit the scope of the disclosures. Indeed, the novel device described herein may be embodied in a variety of other forms or in a variety of combinations of various aspects of the embodiments; furthermore, various omissions, substitutions and changes in the form of the embodiment described herein may be made without departing from the spirit of the disclosures. The accompanying claims and their equivalents are intended to cover such forms or modifications as would fall within the scope and spirit of the disclosures.

What is claimed is:

1. A lid opening and closing device for a semiconductor manufacturing apparatus which comprises:
   a partition wall configured to divide a carrier conveying region and a substrate conveying region, the partition wall having a conveying gateway with an edge portion;
   a carrier including a carrier body and a carrier lid configured to removably engage with the carrier body, the carrier body having a substrate takeout opening with an edge part, the carrier lid having an opening on the front surface thereof, the edge part of the substrate takeout opening of the carrier body configured to make contact with the edge portion of the conveying gateway; and
   an opening/closing door configured to open and close the conveying gateway, the opening/closing door including an opposing surface portion facing the carrier and a lid removal mechanism provided in the opposing surface portion, wherein the lid removal mechanism is configured to enter the carrier lid, to release engagement of the carrier lid with the carrier body, and to hold the carrier lid, the lid opening and closing device comprising:
   a table configured to mount the carrier thereon with a front surface of the carrier lid configured to face toward the conveying gateway;
   a gas injecting hole provided in the opposing surface portion and configured to supply a purge gas used in removing particles adhering to the carrier lid;
   an advancing/retreating mechanism configured to move the carrier placed on the table toward and away from the opposing surface portion; and
   a control unit configured to output a control signal such that based on the control signal, a purge gas is supplied from the gas injecting hole to the carrier lid when the carrier is at an effective gas supply position at which a distance between the opposing surface portion and the carrier lid, which is spaced apart from the opposing surface portion, is 5 mm or less,
   wherein the carrier lid is subsequently removed from the carrier when the lid removal mechanism of the opposing surface portion comes into engagement with the carrier lid.

2. The device of claim 1, wherein the control unit is configured to output a control signal such that the carrier is moved forward to the effective gas supply position at a first speed and the carrier is stopped in the effective gas supply position or further moved toward the opposing surface portion beyond the effective gas supply position at a second speed slower than the first speed while continuously supplying the purge gas.

3. The device of claim 1, wherein the advancing/retreating mechanism is a mechanism configured to move the table toward and away from the conveying gateway of the partition wall.

4. The device of claim 1, wherein the opposing surface portion has a spiral groove extending outward from the gas injecting hole.

5. The device of claim 1, further comprising:
   a first ionizer configured to ionize the purge gas injected from the gas injecting hole.

6. The device of claim 5, further comprising:
   a filter unit installed above the table and having a filter, the filter unit configured to form a descending air flow by supplying air purified by the filter in a downward direction; and
   a second ionizer configured to ionize the air supplied from the filter unit.

7. A lid opening and closing device for a semiconductor manufacturing apparatus which comprises:
   a partition wall configured to divide a carrier conveying region and a substrate conveying region, the partition wall having a conveying gateway with an edge portion;
   a carrier including a carrier body and a carrier lid configured to removably engage with the carrier body, the carrier body having a substrate takeout opening with an edge part, the carrier lid having an opening on the front surface thereof, the edge part of the substrate takeout opening of the carrier body configured to make contact with the edge portion of the conveying gateway; and
   an opening/closing door configured to open and close the conveying gateway, the opening/closing door including an opposing surface portion facing the carrier and a lid removal mechanism provided in the opposing surface portion, wherein the lid removal mechanism configured to enter the carrier lid, to release engagement of the carrier lid with the carrier body, and to hold the carrier lid; the lid opening and closing device comprising:
   a table configured to mount the carrier thereon with a front surface of the carrier lid configured to face toward the conveying gateway;
   a gas injecting hole provided in the opposing surface portion, and configured to supply a purge gas used in removing particles adhering to the carrier lid when the carrier is at an effective gas supply position at which a distance between the opposing surface portion and the carrier lid, which is spaced apart from the opposing surface potion, is 5 mm or less;
   an advancing/retreating mechanism configured to move the carrier placed on the table toward and away from the opposing surface portion; and
   a first ionizer configured to ionize the purge gas injected from the gas injecting hole.

8. The device of claim 7, further comprising:
   a filter unit installed above the table and having a filter, the filter unit configured to form a descending air flow by supplying air purified by the filter in a downward direction; and
   a second ionizer configured to ionize the air supplied from the filter unit.

* * * * *